United States Patent
Chang et al.

(10) Patent No.: US 9,264,046 B2
(45) Date of Patent: *Feb. 16, 2016

(54) RESONANT INDUCTOR COUPLING CLOCK DISTRIBUTION

(71) Applicant: Broadcom Corporation, Irvine, CA (US)

(72) Inventors: David Chang, Irvine, CA (US); Ajat Hukkoo, Cupertino, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/626,445

(22) Filed: Feb. 19, 2015

(65) Prior Publication Data

US 2015/0162914 A1  Jun. 11, 2015

Related U.S. Application Data

(63) Continuation of application No. 13/849,115, filed on Mar. 22, 2013, now Pat. No. 9,000,805.

(60) Provisional application No. 61/757,947, filed on Jan. 29, 2013.

(51) Int. Cl.
| | |
|---|---|
| *H03K 19/096* | (2006.01) |
| *G06F 5/16* | (2006.01) |
| *G06F 1/26* | (2006.01) |
| *G06F 1/32* | (2006.01) |
| *G06F 1/00* | (2006.01) |
| *G06F 1/10* | (2006.01) |
| *H01F 38/14* | (2006.01) |
| *H02J 5/00* | (2006.01) |

(52) U.S. Cl.
CPC ........... *H03K 19/096* (2013.01); *G06F 1/00* (2013.01); *G06F 1/10* (2013.01); *G06F 1/266* (2013.01); *G06F 1/3287* (2013.01); *G06F 5/16* (2013.01); *H01F 38/14* (2013.01); *H02J 5/005* (2013.01)

(58) Field of Classification Search
CPC .................................. H03K 5/05; G06F 1/04
USPC .......................................... 326/38–41, 46, 93
See application file for complete search history.

(56) References Cited

U.S. PATENT DOCUMENTS

| | | | |
|---|---|---|---|
| 5,627,733 | A | 5/1997 | Bressler |
| 5,734,285 | A * | 3/1998 | Harvey .................. 327/291 |
| 6,532,544 | B1 * | 3/2003 | Masleid et al. ............ 713/500 |
| 6,882,182 | B1 | 4/2005 | Conn et al. |
| 7,719,316 | B2 | 5/2010 | Chueh et al. |
| 2008/0068041 | A1 | 3/2008 | Madurawe |
| 2014/0028344 | A1 | 1/2014 | Penzes et al. |
| 2014/0035649 | A1 | 2/2014 | Nedovic |

* cited by examiner

*Primary Examiner* — Don Le
(74) *Attorney, Agent, or Firm* — Sterne, Kessler, Goldstein & Fox P.L.L.C.

(57) ABSTRACT

The present disclosure provides for a clock distribution network for distributing clocking signals within a synchronous sequential logic circuit. The clock distribution network distributes the one or more clock signals by inductively and/or capacitively coupling a clocking signal from a primary distribution node to various secondary distribution nodes within the synchronous sequential logic circuit. The various secondary distribution nodes resonate at respective resonant frequencies to generate other clocking signals for use within the synchronous sequential logic circuit in response to receiving the clocking signal.

20 Claims, 7 Drawing Sheets

RESONANT INDUCTOR COUPLING CLOCK DISTRIBUTION

CROSS-REFERENCE TO RELATED APPLICATIONS

The present application is a continuation of U.S. patent application Ser. No. 13/849,115, filed Mar. 22, 2013, now U.S. Pat. No. 9,000,805, which claims the benefit of U.S. Provisional Patent Appl. No. 61/757,947, filed Jan. 29, 2013, each of which is incorporated herein by reference in its entirety.

BACKGROUND

1. Field of Disclosure

The present disclosure generally relates to clock distribution within a synchronous sequential logic circuit and specifically to using magnetic coupling to distribute a reference clocking signal from a common point to various locations within the synchronous sequential logic circuit.

2. Related Art

An electronic circuit is composed of one or more electronic components, such as resistors, transistors, capacitors, inductors, and/or diodes to provide some examples, which are connected together by conductive wires or traces. The electronic circuit can be an analog electronic circuit in which electric signals therein can vary continuously with time, a digital electronic circuit in which electric signals therein can be formed of discrete values, and/or any combination of the analog and the digital electronic circuits, often referred to as a mixed-signal or a hybrid circuit. The digital electronic circuit is often constructed from logic gates which can be used to create a combinational logic circuit. One or more combinational logic circuits can be combined with various memory elements, such as a flip-flop to provide an example, which then can be combined with other combinations of combinational logic circuits and memory elements to form a sequential logic circuit that is designed to perform a sequence of operations. The sequential logic circuit can be categorized as being either a synchronous sequential logic circuit which changes state when one or more clock signals change state or an asynchronous sequential logic circuit which changes state regardless of the one or more clock signals.

The one or more clock signals are distributed within the synchronous sequential logic circuit using a clock distribution network, also referred to a clock tree in some situations. The clock distribution network distributes the one or more clock signals from a common point to various locations within the synchronous sequential logic circuit. Often times, data within the synchronous sequential logic circuit is provided with a temporal reference by the one or more clock signals; therefore, the one or more clock signals should be particularly clean and sharp as they are being distributed by the clock distribution network. Additionally, the one or more clock signals are particularly affected by technology scaling within the synchronous sequential logic circuit. For example, long global interconnections within the clock distribution network become much more highly resistive as their dimensions are decreased. Further, delay in of the one or more clock signals attributed to the clock distribution network can severely limit maximum performance of the synchronous sequential logic circuit as well as create race conditions in the synchronous sequential logic circuit.

BRIEF DESCRIPTION OF THE DRAWINGS/FIGURES

The present disclosure is described with reference to the accompanying drawings. In the drawings, like reference numbers indicate identical or functionally similar elements. Additionally, the left most digit(s) of a reference number identifies the drawing in which the reference number first appears.

Figure 1:
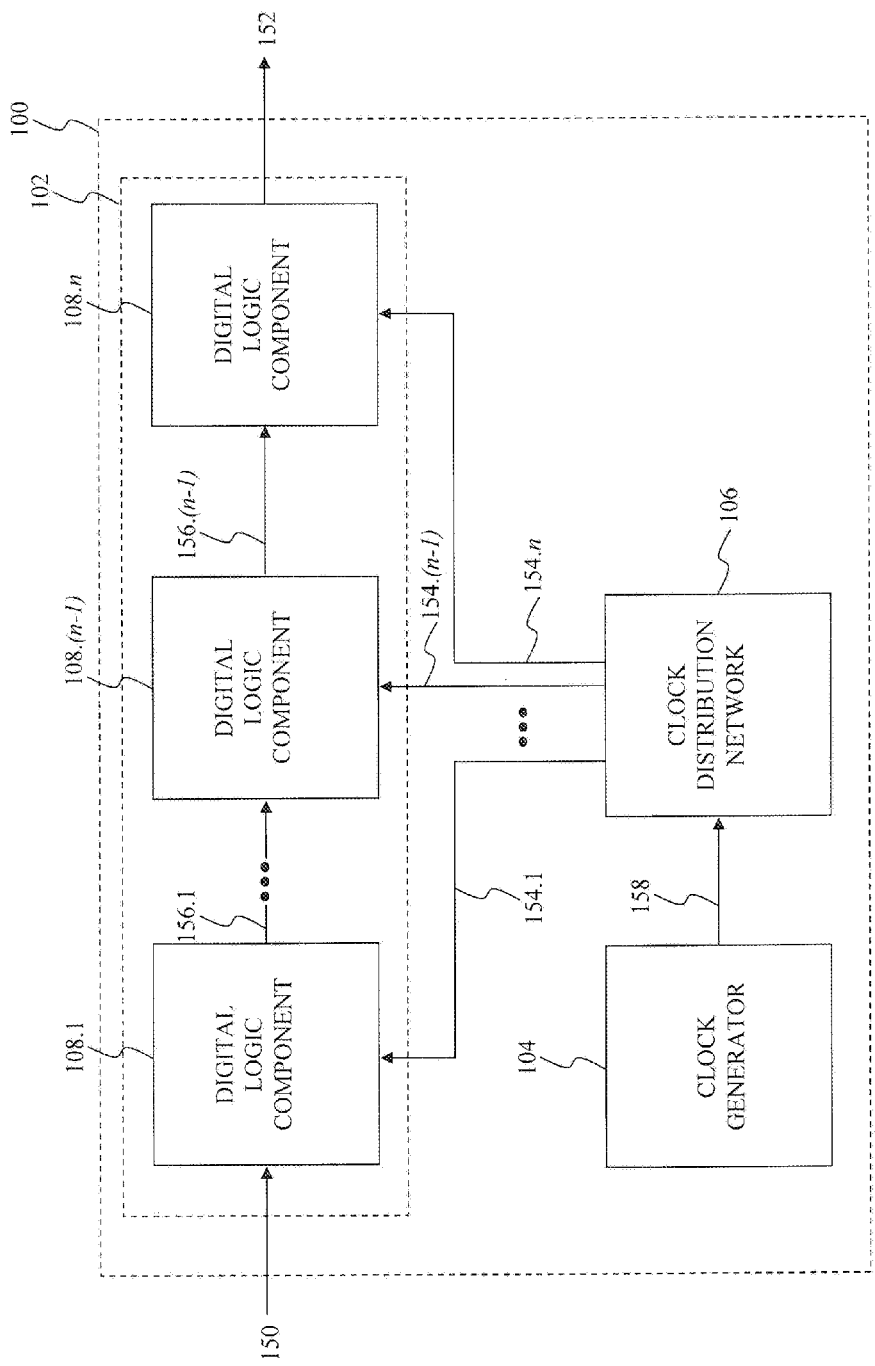
FIG. 1 illustrates a block diagram of an exemplary synchronous sequential logic system according to an exemplary embodiment of the present disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting, information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

Overview

The present disclosure provides for a clock distribution network for distributing clocking signals within a synchronous sequential logic circuit. The clock distribution network distributes the one or more clock signals by inductively and/or capacitively coupling a reference clocking signal from a primary distribution node to various secondary distribution nodes within the synchronous sequential logic circuit. The various secondary distribution nodes resonate at respective resonant frequencies to generate clocking signals for use within the synchronous sequential logic circuit in response to receiving the reference clocking signal.

Exemplary Synchronous Sequential Logic System

FIG. 1 illustrates a block diagram of an exemplary synchronous sequential logic system according to an exemplary embodiment of the present disclosure. A synchronous sequential logic system 100 sequentially operates upon a digital input 150 in accordance with one or more clocking signals to provide a digital output 152. Typically, the synchronous sequential logic system 100 represents a sequential digital system which changes state when one or more operational clocking signals change state. The synchronous sequential logic system 100 relies on inductive and/or capacitive coupling to distribute a reference clocking signal from a common point to various locations within the synchronous sequential logic system 100 that resonate at respective resonant frequencies to provide the one or more operational clocking signals. The synchronous sequential logic system 100 includes a sequential logic module 102, a clock generator 104, and a clock distribution network 106.

The sequential logic module 102 sequentially processes the digital input 150 in accordance with operational clocking signals 154.1 through 154.$n$ to provide the digital output 152. The sequential logic module 102 includes digital logic components 108.1 through 108.$n$ that collectively perform a digital logic function. The digital logic components 108.1 through 108.$n$ can provide one or more Boolean logic functions, such as AND, OR, XOR, XNOR, and/or NOT to provide some examples, in combination with one or more memory or storage functions, such as a flipflop or a latch to provide some examples. Typically, the digital logic components 108.1 through 108.$n$ operate upon their corresponding input signals to provide processed digital outputs 156.1 through 156.($n-1$) and/or the digital output 152 in accordance with the operational clocking signals 154.1 through 154.$n$. The operational clocking signals 154.1 through 154.$n$ trigger their corresponding digital logic components 108.1 through 108.$n$ to operate upon their corresponding input signals at substantially similar instances in time, at regular intervals. The digital logic components 108.1 through 108.$n$ can change states, namely from a first state to a second state, or can remain in the same state, namely the first state, when triggered by their corresponding operational clocking signals 154.1 through 154.$n$. Whether the digital logic components 108.1 through 108.$n$ change states or remain in the same states are determined by their current states and the value of their corresponding input signals.

The clock generator 104 provides a reference clocking signal 158 that causes the clock distribution network 106 to resonate at various resonant frequencies to provide the operational clocking signals 154.1 through 154.$n$. The clock generator 104 represents a common point within the synchronous sequential logic system 100 which forms the basis of the operational clocking signals 154.1 through 154.$n$. The clock generator 104 can be implemented using an electronic oscillator that produces a repetitive, oscillating electronic signal or an electronic oscillator in combination with other electronic circuits, such as a phase-locked loop to provide an example.

The clock distribution network 106 inductively and/or capacitively couples the reference clocking signal 158 to various resonant circuits within the clock distribution network 106. These various resonant circuits resonant at respective resonant frequencies to provide the operational clocking signals 154.1 through 154.$n$ to the sequential logic module 102. The clock distribution network 106 can be characterized as including a primary distribution node having a primary coupling element, such as a primary inductance and/or a primary capacitance to provide some examples, and one or more secondary distribution nodes having one or more secondary coupling elements, such as one or more secondary inductances and/or one or more secondary capacitances to provide some examples. Typically, the reference clocking signal 158 is inductively and/or capacitively coupled from the primary coupling element onto the one or more secondary coupling elements. In this situation, the one or more secondary coupling elements resonate at their resonant frequencies in response to receiving the reference clocking signal 158 to provide the operational clocking signals 154.1 through 154.$n$.

Figure 2:
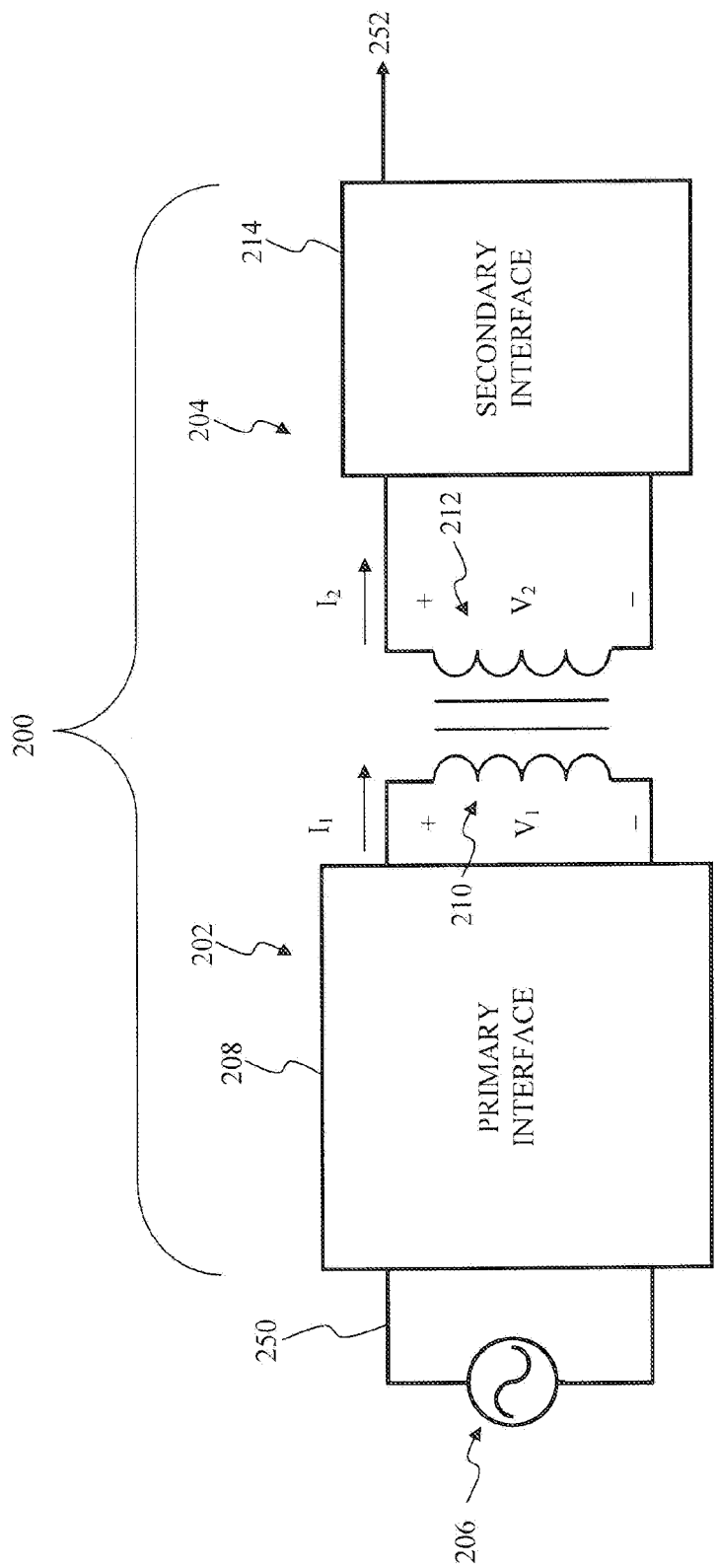
FIG. 2 illustrates a block diagram of an exemplary mutual inductance clock distribution network that can be implemented within the synchronous sequential logic system according to an exemplary embodiment of the present disclosure.

Exemplary Mutual Inductance Clock Distribution Network that can be Implemented within the Synchronous Sequential Logic System FIG. 2 illustrates a block diagram of an exemplary mutual inductance clock distribution network that can be implemented within the synchronous sequential logic system according to an exemplary embodiment of the present disclosure. A clock distribution network 200 distributes one or more clock signals, such as the operational clocking signals 154.1 through 154.n to provide an example, from a common point to various locations within a synchronous sequential logic circuit. The clock distribution network 200 includes a primary distribution node 202 and a secondary distribution node 204. The clock distribution network 200 can represent an exemplary embodiment of the clock distribution network 106.

The primary distribution node 202 effectively transfers a primary clocking signal 250 to the secondary distribution node 204 via mutual inductance between the primary distribution node 202 and the secondary distribution node 204. The primary distribution node 202 includes a primary interface 208 and a first inductance 210. The primary interface 208 can be implemented using one or more passive devices, such as one or more resistors, one or more capacitors, and/or one or more inductors to provide some examples, one or more active devices, such as one or more switches to provide some examples, and/or one or more transmission lines to couple the one or more passive devices and/or the one or more active devices to the clock generator 206 and/or the first inductance 210.

The primary clocking signal 250 causes a first voltage $V_1$ to appear onto the first inductance 210 which causes a first current $I_1$ to flow through the first inductance 210. The first voltage $V_1$ and/or the first current $I_1$ are effectively transferred from the first inductance 210 to a second inductance 212 within the secondary distribution node 204 to provide a second voltage $V_2$ and/or a second current $I_2$ to the secondary distribution node 204. Mutual inductance occurs when the first inductance 210 and the second inductance 212 are arranged so that a change in the first current $I_1$ in the first inductance 210 causes the second voltage $V_2$ to be induced in the second inductance 212. Specifically, changes in the first current $I_1$ cause the first inductance 210 to generate a changing magnetic field which induces the second voltage $V_2$ onto the second inductance 212. Typically, the second voltage $V_2$ can be given by:

$$v_2^m(t) = L_2 \frac{dI_2}{dt} - M_{21} \frac{dI_1}{dt}, \quad (1)$$

where $v_2^m(t)$ represents the second voltage $V_2$, $L_2$ represents the inductance of the second inductance 212, $M_{21}$ represents the mutual inductance between the second inductance 212 and the first inductance 210, and $$\frac{dI_2}{dt} \text{ and } \frac{dI_1}{dt}$$

represent the change, or derivative, of the second current $I_2$ and the first current $I_1$ with respect to time. It should be noted that the minus sign arises because of the sense the second current $I_2$ has been defined in FIG. 2. If the first current $I_1$ and the second current $I_2$ were to be defined as flowing towards the dots, then the sign of the mutual inductance $M_{21}$ will be positive. The mutual inductance $M_{21}$ can be given by:

$$M_{21} = k\sqrt{L_1 L_2}, \quad (2)$$

where $L_1$ and $L_2$ represent inductances of the first inductance 210 and the second inductance 212, respectively, and k represents a coupling coefficient between the first inductance 210 and the second inductance 212, usually $0 \leq k \leq 1$.

Often times, when the first inductance 210 and the second inductance 212 are closely coupled to each other, to form a transformer, the second voltage $V_2$ can be approximated as:

$$V_2 = \frac{N_2}{N_1} V_1. \quad (3)$$

Likewise, the second current $I_2$ can be approximated as:

$$I_2 = \frac{N_2}{N_1} I_1, \quad (4)$$

where $V_1$ and $V_2$ represent the first voltage $V_1$ and the second voltage $V_2$, respectively, $I_1$ and $I_2$ represent the first current $I_1$ and the second current $I_2$, respectively, and $N_1$ and $N_2$ represent numbers of turns in the first inductance 210 and the second inductance 212, respectively.

The secondary distribution node 204 inductively receives the primary clocking signal 250 from the primary distribution node 202. The secondary distribution node 204 includes the second inductance 212 and a secondary interface 214. The secondary interface 214 can be implemented using one or more passive devices, such as one or more resistors, one or more capacitors, and/or one or more inductors to provide some examples and/or one or more transmission lines to couple the one or more passive devices to the second inductance 212 and/or to digital logic components within the synchronous sequential logic circuit. The one or more passive devices and the second inductance 212 are configured and arranged to form a resonant tuned circuit, such as a LC tuned circuit or RLC tuned circuit to provide some examples. Typically, the one or more passive devices include one or more charge storage elements, such as one or more capacitors to provide an example. Once these storage elements are charged, or near completely charged, the secondary distribution node 204 begins to resonate or oscillate at a resonant frequency to provide a secondary clocking signal 252.

A clock generator 206 provides the primary clocking signal 250 for use by the primary distribution node 202. The clock generator 206 can be implemented as single or multiple frequency modulated signal source. When implemented as the single frequency modulated signal source, the second inductance 212 will select the primary clocking signal 250 when it is sufficient to meet the resonant frequency. When implemented as the multiple frequency modulated signal source, the second inductance 212 will select one or more of those frequency modulated signals of the primary clocking signal 250 that are sufficient to meet the resonant frequency.

Figure 3:
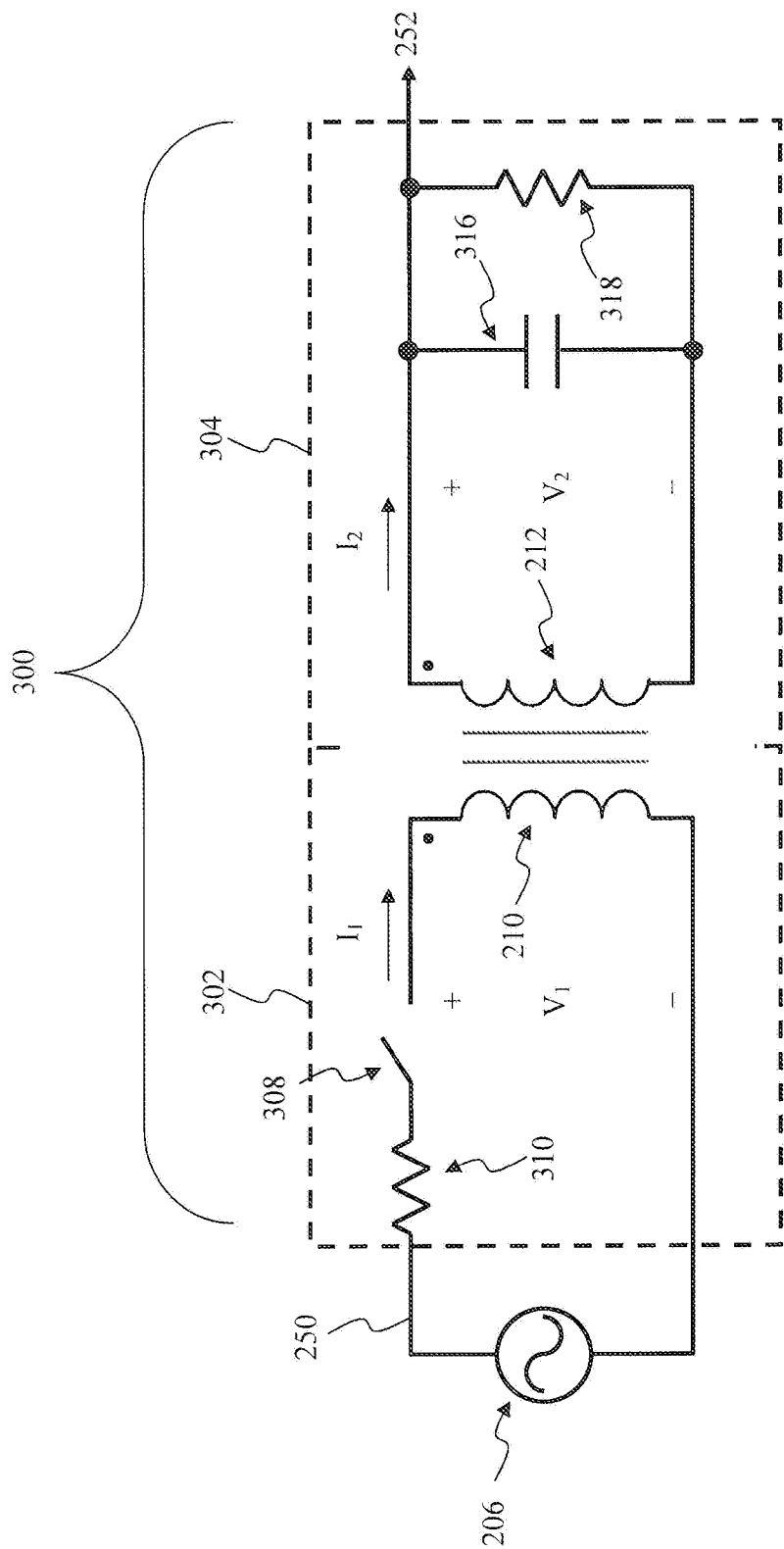
FIG. 3 illustrates a block diagram of a first exemplary mutual inductance clock distribution network according to an exemplary embodiment of the present disclosure.

First Exemplary Embodiment of the Exemplary Mutual Inductance Clock Distribution Network FIG. 3 illustrates a block diagram of a first exemplary mutual inductance clock distribution network according to an exemplary embodiment of the present disclosure. A clock distribution network 300 distributes one or more clock signals, such as the operational clocking signals 154.1 through 154.n to provide an example, from a common point to various locations within a synchronous sequential logic circuit. The clock distribution network 300 includes a primary distribution node 302 and a secondary distribution node 304. The clock distribution network 300 can represent an exemplary embodiment of the clock distribution network 106.

The primary distribution node 302 effectively transfers a primary clocking signal 250 to the secondary distribution node 304 via mutual inductance between the primary distribution node 302 and the secondary distribution node 304. As illustrated in FIG. 3, the clock generator 206 provides the primary clocking signal 250 for use by the primary distribution node 302. The primary distribution node 302 includes the first inductance 210, a switch 308, and a first resistance 310. The switch 308 and the first resistance 310 represent an exemplary embodiment of the primary interface 208. Ideally, when the first resistance 310 is zero or approximately zero, the primary clocking signal 250 causes a first voltage $V_1$ to be applied to the first inductance 210 and/or a first current to flow through the first inductance 210 when the switch 308 is closed, namely in a conducting state. The first voltage $V_1$ and/or the first current $I_1$ are effectively transferred from the primary distribution node 302 to the secondary distribution node 304 to provide a secondary clocking signal 252 for use by the synchronous sequential logic circuit. The secondary clocking signal 252 can represent an exemplary embodiment of one or more of the operational clocking signals 154.1 through 154.n.

The secondary distribution node 304 inductively receives the primary clocking signal 250 from the primary distribution node 302 via mutual inductance between the first inductance 210 and the second inductance 212. The secondary distribution node 304 includes the second inductance 212, a capacitance 316, and a second resistance 318. The capacitance 316 and the second resistance 318 can represent an exemplary embodiment of the secondary interface 214. Mutual inductance occurs when the first inductance 210 and the second inductance 212 are arranged so that a change in the first current $I_1$ in the first inductance 210 causes the second voltage $V_2$ to be induced in the second inductance 212. Specifically, changes in the first current $I_1$ cause the first inductance 210 to generate a changing magnetic field which induces the second voltage $V_2$ onto the second inductance 212. As illustrated in FIG. 3, the second inductance 212 and the capacitance 316 are configured and arranged to form a resonant tuned circuit. Although a parallel resonant LC tuned circuit is illustrated in FIG. 3, those skilled in the relevant art(s) will recognize that the secondary distribution node 304 can be configured and arranged to form other types of resonant tuned circuits without departing from the scope of the present disclosure.

Ideally, when the second resistance 318 is zero or approximately zero, changes in the second voltage $V_2$ cause the second inductance 212 to provide the second current $I_2$ which stores energy within, or charges, the capacitance 316. The capacitance 316 is completely charged after a duration of $$\tau = \frac{\pi}{2}\sqrt{LC},\quad (5)$$

where τ represents a duration in time, typically seconds, for the capacitance 316 to completely charge, L represents an inductance of the second inductance 212, C represents an effective capacitance of digital logic components within the synchronous sequential logic circuit and capacitance of transmission lines between the second inductance 212 and the capacitance 316. For example, if the secondary clocking signal 252 is to be used by multiple digital logic components within the synchronous sequential logic circuit, then C represents an effective input capacitance of these digital logic components.

Once the capacitance 316 is completely, or near completely charged, the switch 308 can be opened, namely placed in a non-conducting state, and the secondary distribution node 304 begins to resonate or oscillate at a resonant frequency. The resonant frequency can be denoted by:

$$f = \frac{1}{2\pi\sqrt{LC}},\quad (6)$$

where f represents the resonant frequency of the secondary distribution node 304, L represents the inductance of the second inductance 212, C represents the effective capacitance of digital logic components within the synchronous sequential logic circuit and the capacitance of transmission lines between the second inductance 212 and the capacitance 316. In some situations, the clock generator 206 can be disabled, powered down, or turned off when the switch 308 is opened to save power within the synchronous sequential logic circuit.

However, in practice, the first resistance 310 and/or the second resistance 318 can be larger than zero such that the first resistance 310 and the second resistance 318 can dampen the primary clocking signal 250 and the secondary clocking, signal 252, respectively. For example, the first resistance 310 can represent a resistance of a transmission line between the clock generator 206 and the primary distribution node 402. As another example, the second resistance 318 can represent an effective input resistance of the digital logic components within the synchronous sequential logic circuit. The first resistance 310 and/or the second resistance 318 effectively dampen the first current $I_1$ and/or the first voltage $V_1$ and the second current $I_2$, and/or the second voltage $V_2$, respectively. As a result, the secondary clocking signal 252 can decay once the switch 308 is opened. In this situation, the switch 308 continually remains in the closed state; however, the primary clocking signal 250 is sufficiently reduced to provide a small constant charge to the secondary distribution node 304 to compensate for the dampening of the first current $I_1$, the first voltage $V_1$, the second current $I_2$, and/or the second voltage $V_2$.

Typically in practice, the first resistance 310 and/or the second resistance 318 are power energy consuming components and convert electrical magnetic energy to the heat energy. The first inductance 210, the second inductance 212, and/or the capacitance 316 are energy storage components and exchange the energy between components and ideally are not power energy consuming components. For a given time period T for the primary clocking signal 250, the power dissipation for the first resistance 310 is demoted as:

$$W_1 = R_1 I^2 T,\quad (7)$$

where $W_1$ represents the power dissipation of the first resistance 310, $R_1$ represents the resistance of the first resistance 310, I represents an average current of the primary clocking signal 250. The power dissipation of the second resistance 318 is denoted as:

$$W_2 = R_2 I^2 T,\quad (7)$$

where $W_2$ represents the power dissipation of the second resistance 318, and $R_2$ represents the resistance of the second resistance 318.

Therefore, the small constant charge to the secondary distribution node 304 should provide a total energy ($W_T$) of:

$$W_T = W_1 + W_2. \quad (8)$$

This total energy $W_T$ should be sufficient enough to compensate for loss due to the first resistance 310 and the second resistance 318. In some situations, the first resistance 310 can be approximately equal to the second resistance 318 such that:

$$W_T = 2W_2. \quad (9)$$

However, when the first resistance 310 differs from the second resistance 318, the total energy $W_T$ can be denoted as:

$$W_T = W_1 \left(1 + \frac{KR_1}{R_2}\right), \quad (10)$$

where K represents a coupling factor, often times the mutual inductance $M_{21}$ between the second inductance 212 and the first inductance 210.

Figure 4:
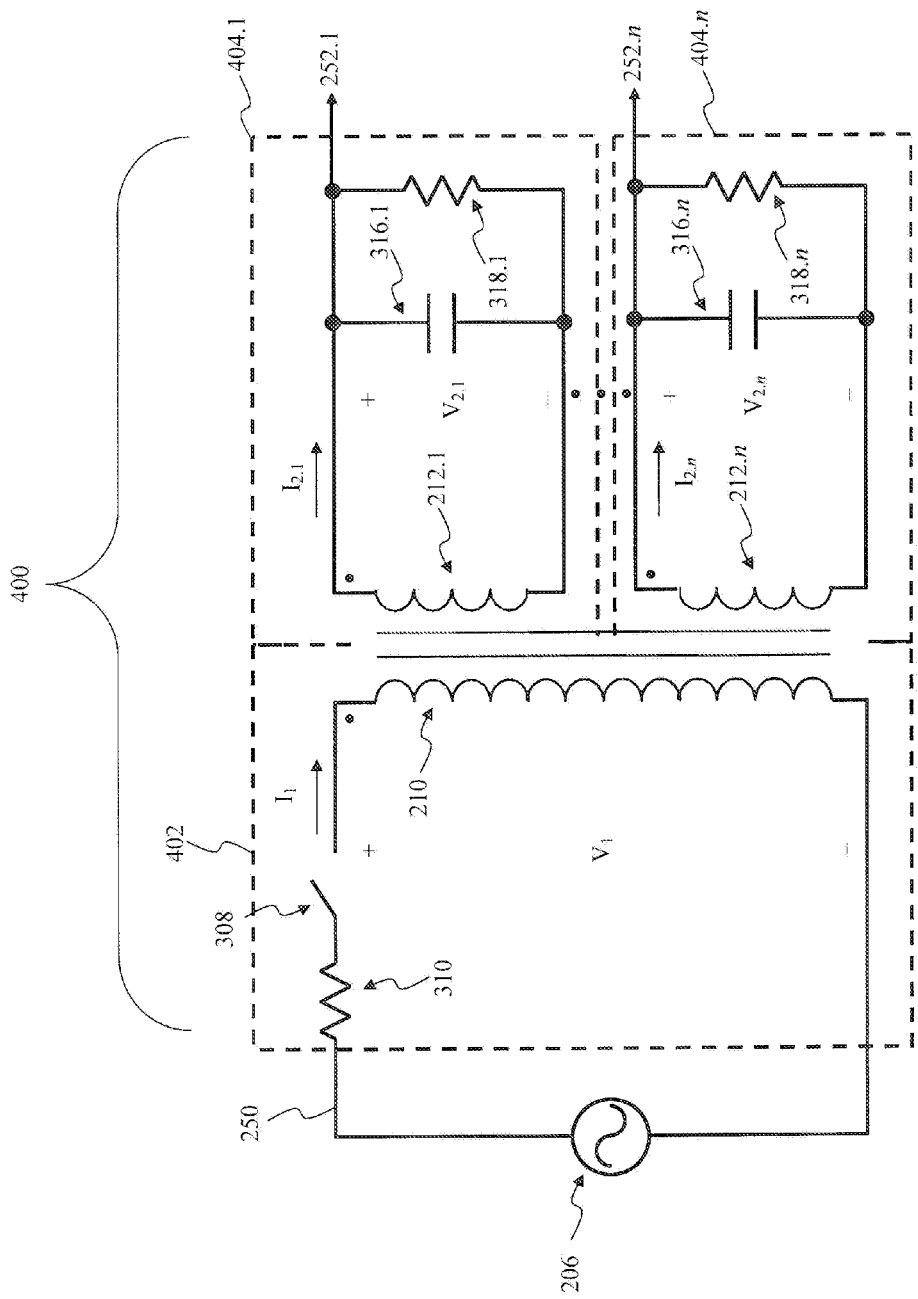
FIG. 4 illustrates a block diagram of a second exemplary mutual inductance clock distribution network according to an exemplary embodiment of the present disclosure.

Second Exemplary Embodiment of the Exemplary Mutual Inductance Clock Distribution Network FIG. 4 illustrates a block diagram of a second exemplary mutual inductance clock distribution network according to an exemplary embodiment of the present disclosure. A clock distribution network 400 distributes multiple clock signals, such as the operational clocking signals 154.1 through 154.$n$ to provide an example, from a common point to various locations within a synchronous sequential logic circuit. The clock distribution network 400 includes a primary distribution node 402 and secondary distribution nodes 404.1 through 404.$n$. The clock distribution network 400 can represent an exemplary embodiment of the clock distribution network 106. The clock distribution network 400 shares many features in the common with the clock distribution network 300; therefore, only differences between the clock distribution network 300 and the clock distribution network 400 are to be discussed in further detail below.

The primary distribution node 402 effectively transfers the primary clocking signal 250 to the secondary distribution nodes 404.1 through 404.$n$ via mutual inductance between the primary distribution node 402 and the secondary distribution nodes 404.1 through 404.$n$. Ideally, when the first resistance 310 is zero or approximately zero, the primary clocking signal 250 causes a first voltage $V_1$ to be applied to the first inductance 210 and/or a first current $I_1$ to flow through the first inductance 210 when the switch 308 is closed, namely in a conducting state. The first voltage $V_1$ and/or the first current $I_1$ are effectively transferred from the primary distribution node 402 to the secondary distribution nodes 404.1 through 404.$n$ to provide secondary clocking signals 252.1 through 252.$n$ for use by the synchronous sequential logic circuit. The secondary clocking signals 252.1 through 252.$n$ can represent exemplary embodiments of one or more of the operational clocking signals 154.1 through 154.$n$.

The secondary distribution nodes 404.1 through 404.$n$ include second inductances 212.1 through 212.$n$, capacitances 316.1 through 316.$n$, and second resistances 318.1 through 318.$n$. Mutual inductance occurs when the first inductance 210 and the second inductances 212.1 through 212.$n$ are arranged so that a change in the first current $I_1$ in the first inductance 210 causes second voltages $V_{2.1}$ through $V_{2.n}$ to be induced in the second inductances 212.1 through 212.$n$. Specifically, changes in the first current $I_1$ cause the first inductance 210 to generate a changing magnetic field which induces the second voltages $V_{2.1}$ through $V_{2.n}$ onto the second inductances 212.1 through 212.$n$.

Ideally, when the second resistances 318.1 through 318.$n$ are zero or approximately zero, changes in the second voltage $V_{2.1}$ through $V_{2.n}$ cause the second inductances 212.1 through 212.$n$ to provide second current $I_{2.1}$ through $I_{2.n}$ which stores energy within, or charges, the capacitances 316.1 through 316.$n$. Once the capacitances 316.1 through 316.$n$ are completely, or near completely charged, the switch 308 can be opened, namely placed in a non-conducting state, and the secondary distribution nodes 404.1 through 404.$n$ begin to resonate or oscillate at a resonant frequency. The resonant frequency can be denoted by:

$$f_k = \frac{1}{2\pi\sqrt{L_k C_k}}, \quad (11)$$

where $f_k$ represents the resonant frequency of the $k^{th}$ secondary distribution node 404.1 through 404.$n$, $L_k$ represents the inductance of the $k^{th}$ second inductance 212.1 through 212.$n$, $C_k$ represents the effective capacitance of digital logic components coupled to the $k^{th}$ capacitance 316.1 through 316.$n$ within the synchronous sequential logic circuit and the capacitance of transmission lines between the $k^{th}$ second inductance 212.1 through 212.$n$ and the $k^{th}$ capacitance 316.1 through 316.$n$. In some situations, the second inductance 212.1 through 212.$n$ and/or the capacitances 316.1 through 316.$n$ can vary between the secondary distribution nodes 404.1 through 404.$n$ allowing the secondary distribution nodes 404.1 through 404.$n$ to provide secondary clocking signals 252.1 through 252.$n$ having different frequencies.

However, in practice, the first resistance 310 and/or one or more of the second resistances 318.1 through 318.$n$ can be larger than zero such that the first resistance 310 and the second resistances 318.1 through 318.$n$ can dampen the primary clocking signal 250 and secondary clocking signals 252.1 through 252.$n$, respectively. The first resistance 310 and/or the second resistances 318.1 through 318.$n$ effectively dampen the first current $I_1$ and/or the first voltage $V_1$ and the second currents $I_{2.1}$ through $I_{2.n}$, and/or the second voltages $V_{2.1}$ through $V_{2.n}$, respectively. As a result, the secondary clocking signals 252.1 through 252.$n$ can decay once the switch 308 is opened. In this situation, the switch 308 continually remains in the closed state; however, the primary clocking signal 250 is sufficiently reduced to provide a small constant charge to the secondary distribution nodes 404.1 through 404.$n$ to compensate for the dampening of the first current $I_1$ and/or the first voltage $V_1$ and the second currents $I_{2.1}$ through $I_{2.n}$, and/or the second voltages $V_{2.1}$ through $V_{2.n}$.

Therefore, the small constant charge to the secondary distribution nodes 404.1 through 404.$n$ should provide a total energy $(W_T)$ of:

$$W_T = W_1 + W_{2.1} \ldots W_{2.n}, \quad (12)$$

where $W_{2.1} \ldots W_{2.n}$ represents power dissipation of the second resistances 318.1 through 318.$n$. This total energy $W_T$ should be sufficient enough to compensate for loss due to the first resistance 310 and the second resistances 318.1 through 318.$n$.

Figure 5:
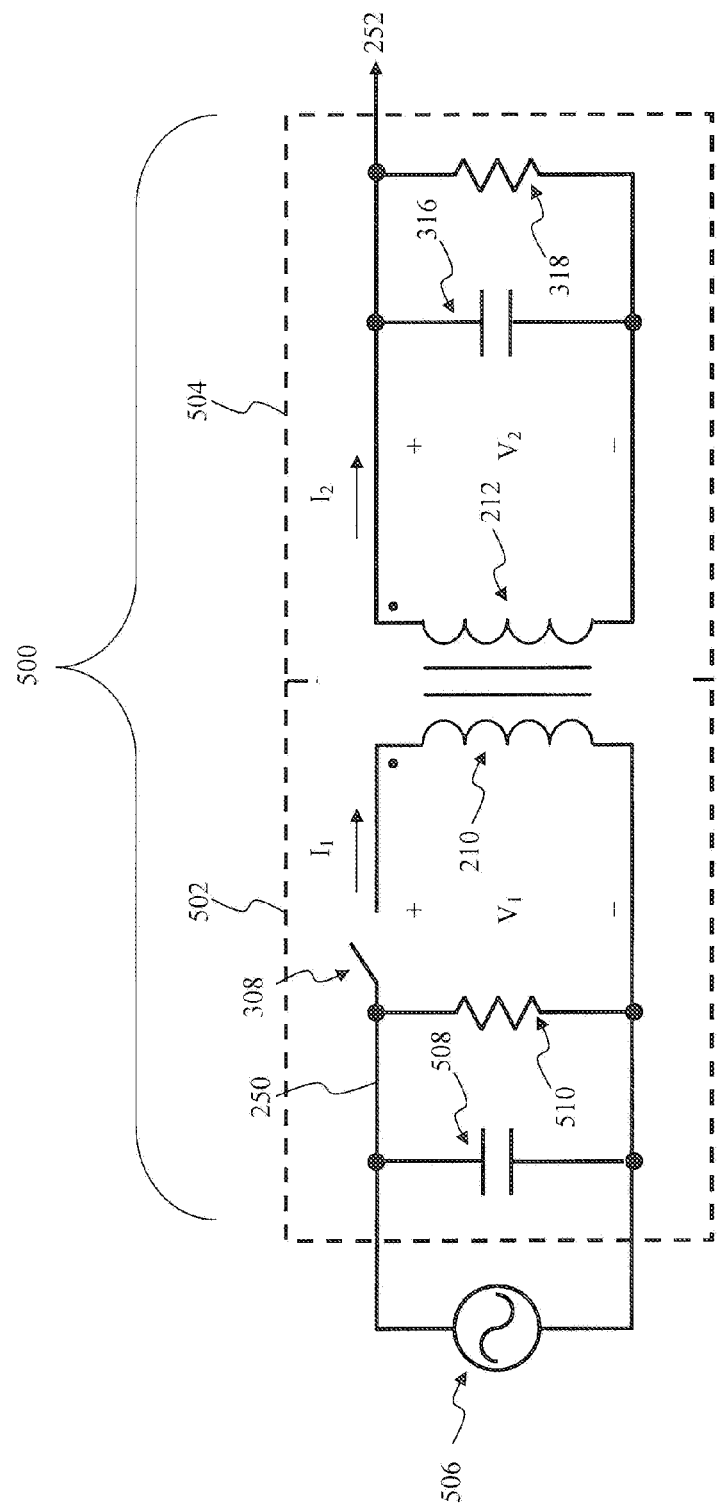
FIG. 5 illustrates a block diagram of a third exemplary mutual inductance clock distribution network according to an exemplary embodiment of the present disclosure.

Third Exemplary Embodiment of the Exemplary Mutual Inductance Clock Distribution Network FIG. 5 illustrates a block diagram of a third exemplary mutual inductance clock distribution network according to an exemplary embodiment of the present disclosure. A clock distribution network 500 distributes one or more clock signals, such as the operational clocking signals 154.1 through 154.$n$ to provide an example, from a common point to various locations within a synchronous sequential logic circuit. The clock distribution network 500 includes a primary distribution node 502 and a secondary distribution node 504. Those skilled in the relevant art(s) will recognize that the primary distribution node 502 can be coupled to multiple secondary distribution nodes 504 to provide multiple secondary clocking signals 252 in a similar manner as described in FIG. 4. The clock distribution network 500 can represent an exemplary embodiment of the clock distribution network 106. The clock distribution network 500 shares many features in the common with the clock distribution network 300; therefore, only differences between the clock distribution network 300 and the clock distribution network 500 are to be discussed in further detail below.

The primary distribution node 502 effectively transfers the primary clocking signal 250 to the secondary distribution node 304 via mutual inductance between the primary distribution node 502 and the secondary distribution node 304. The primary distribution node 302 includes the first inductance 210, the switch 308, a first capacitance 508, and a first resistance 510. The switch 308, the first capacitance 508, and the first resistance 510 can represent an exemplary embodiment of the primary interface 208. Ideally, when the first resistance 510 is zero or approximately zero, the first inductance 210 and the first capacitance 508 are configured and arranged to form a resonant tuned circuit when the switch 308 is closed, namely in a conducting state. Although a parallel resonant LC tuned circuit is illustrated in FIG. 5, those skilled in the relevant art(s) will recognize that the primary distribution node 502 can be configured and arranged to form other types of resonant tuned circuits without departing from the scope of the present disclosure.

A clock generator 506 provides a charging current to charge the first capacitance 508. Once the first capacitance 508 is completely, or near completely charged, the clock generator 506 can be disabled, powered down, or turned off and the primary distribution node 302 begins to resonate or oscillate at a resonant frequency. The resonant frequency can be denoted by:

$$f = \frac{1}{2\pi\sqrt{LC}}, \quad (13)$$

where f represents the resonant frequency of the primary distribution node 302 L represents the inductance of the first inductance 210, C represents the effective capacitance of transmission lines between the switch 308 and the clock generator 506.

The primary distribution node 502 effectively transfers the primary clocking signal 250 to the secondary distribution node 504 via mutual inductance between the primary distribution node 502 and the secondary distribution node 504. The primary clocking signal 250 causes a first voltage $V_1$ to be applied to the first inductance 210 and/or a first current $I_1$ to flow through the first inductance 210 when the switch 308 is closed, namely in a conducting state. The first voltage $V_1$ and/or the first current $I_1$ are effectively transferred from the primary distribution node 502 to the secondary distribution node 504 to provide the secondary clocking signal 252 for use by the synchronous sequential logic circuit.

However, in practice, the first resistance 510 can be larger than zero such that the first resistance 510 can dampen the primary clocking signal 250. For example, the first resistance 510 can represent a resistance of a of transmission lines between the switch 308 and the clock generator 506. The first resistance 510 effectively dampens the first current $I_1$ and/or the first voltage $V_1$. As a result, the primary clocking signal 250 can decay once the switch 308 is opened. In this situation, the clock generator 506 provides the small constant charge to the primary distribution node 502 to compensate for the dampening of the first current $I_1$ and/or the first voltage $V_1$.

Figure 6:
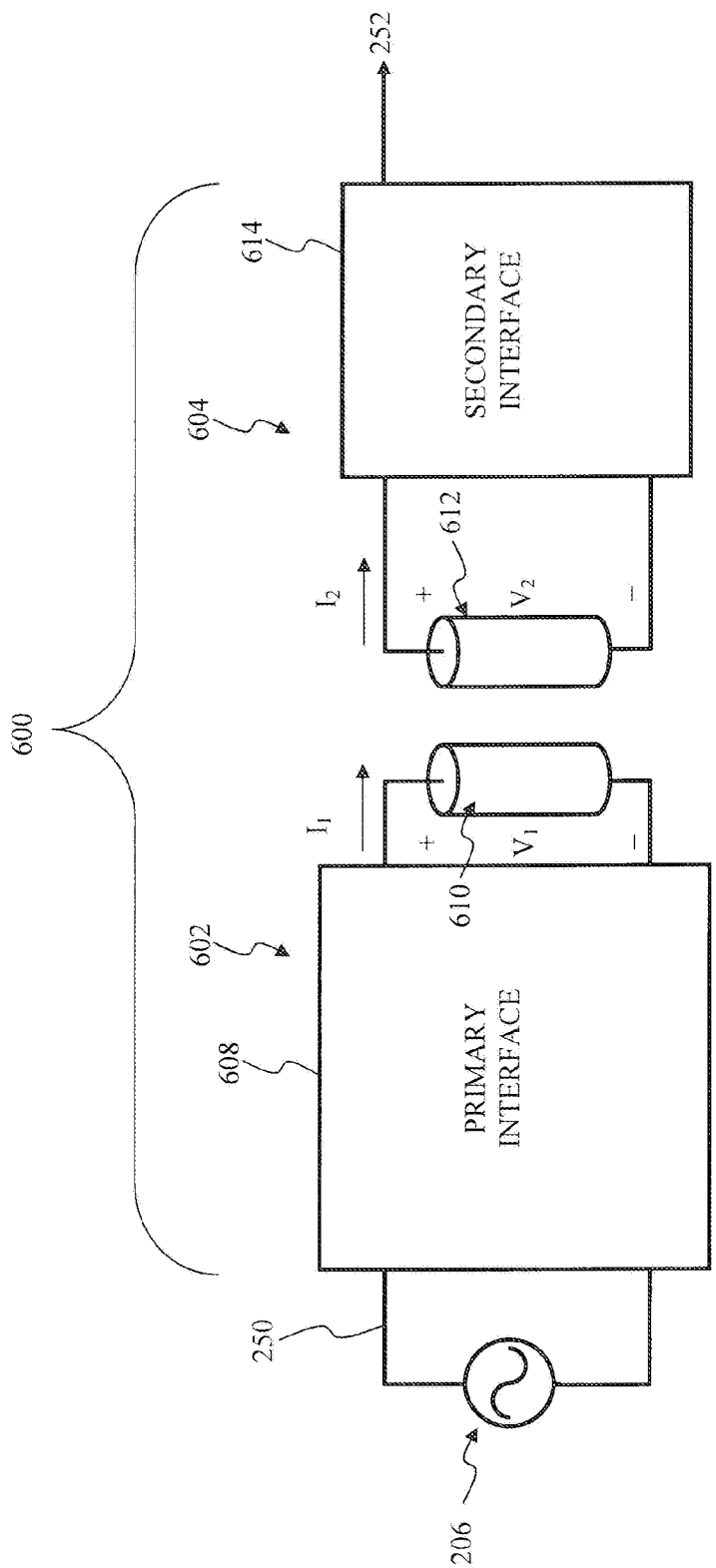
FIG. 6 illustrates a block diagram of an exemplary inductively coupled clock distribution network according to an exemplary embodiment of the present disclosure.

Exemplary Inductively Coupled Clock Distribution Network that can be Implemented within the Synchronous Sequential Logic System FIG. 6 illustrates a block diagram of an exemplary inductively coupled clock distribution network according to an exemplary embodiment of the present disclosure. A clock distribution network 600 distributes one or more clock signals, such as the operational clocking signals 154.1 through 154.n to provide an example, from a common point to various locations within a synchronous sequential logic circuit. The clock distribution network 600 includes a primary distribution node 602 and a secondary distribution node 604. The clock distribution network 600 can represent an exemplary embodiment of the clock distribution network 106.

The primary distribution node 602 effectively transfers the primary clocking signal 250 to the secondary distribution node 604 via inductive coupling. The primary distribution node 602 includes a primary interface 608 and a first transmission line 610. The primary interface 608 can be implemented using one or more passive devices, such as one or more resistors, one or more capacitors, and/or one or more inductors to provide some examples, one or more active devices, such as one or more switches to provide some examples, and/or one or more transmission lines to couple the one or more passive devices and/or the one or more active devices to the clock generator 206 and/or the first transmission line 610. The first transmission line 610 can include one or more coaxial cables, one or more copper cables, such as a flexible flat cable to provide an example, one or more bond wires, such as aluminum, copper, or gold bond wires to provide some examples, one or more wave guides, such as stripline or microstrip, to provide an example, or any combination thereof.

The primary clocking signal 250 causes a first voltage $V_1$ to appear onto the first transmission line 610 which causes a first current $I_1$ to flow through the first transmission line 610. The first voltage $V_1$ and/or the first current $I_1$ are effectively transferred from the first transmission line 610 to a second transmission line 612 within the secondary distribution node 604 to provide a second voltage $V_2$ and/or a second current $I_2$ to the secondary distribution node 604. Inductively coupling occurs when the first transmission line 610 and the second transmission line 612 are arranged so that a change in the first current $I_1$ in the first transmission line 610 causes the second voltage $V_2$ to be induced in the second transmission line 612. Specifically, changes in the first current $I_1$ cause the first transmission line 610 to generate a changing magnetic field which induces the second voltage $V_2$ onto the second transmission line 612.

The secondary distribution node 604 inductively receives the primary clocking signal 250 from the primary distribution node 602. The secondary distribution node 604 includes the second transmission line 612 and a secondary interface 614. The second transmission line 612 can include one or more coaxial cables, one or more copper cables, such as a flexible flat cable to provide an example, one or more bond wires, such as aluminum, copper, or gold bond wires to provide some examples, one or more wave guides, such as stripline or microstrip, to provide an example, or any combination thereof.

The secondary interface 614 can be implemented using one or more passive devices, such as one or more resistors, one or more capacitors, and/or one or more inductors to provide some examples and/or one or more transmission lines to couple the one or more passive devices to the second transmission line 612 and/or to digital logic components within the synchronous sequential logic circuit. The one or more passive devices and the second transmission line 612 are configured and arranged to form a resonant tuned circuit, such as a LC tuned circuit or RLC tuned circuit to provide some examples. Typically, the one or more passive devices include one or more charge storage elements, such as one or more capacitors to provide an example. Once these storage elements are charged, or near completely charged, the secondary distribution node 604 begins to resonate or oscillate at a resonant frequency to provide the secondary clocking signal 252

The primary interface 608 and/or the secondary interface 614 can be implemented in a substantially similar manner as the primary interface 208 and/or the secondary interface 214 as described in FIG. 2 through FIG. 5. In some situations, the first transmission line 610 and/or the second transmission line 612 can be implemented using the first inductance 210 and/or the second inductance 212, respectively. In some situations, the first transmission line 610 and/or the second transmission line 612 are configured and arranged to form a standing wave at approximately a frequency of the primary clocking signal 250. This standing wave configuration and arrangement can reduce distortion and/or interference caused by reflections of the first current $I_1$ and/or the second current $I_2$ as they traverse the first transmission line 610 and/or the second transmission line 612, respectively.

Figure 7:
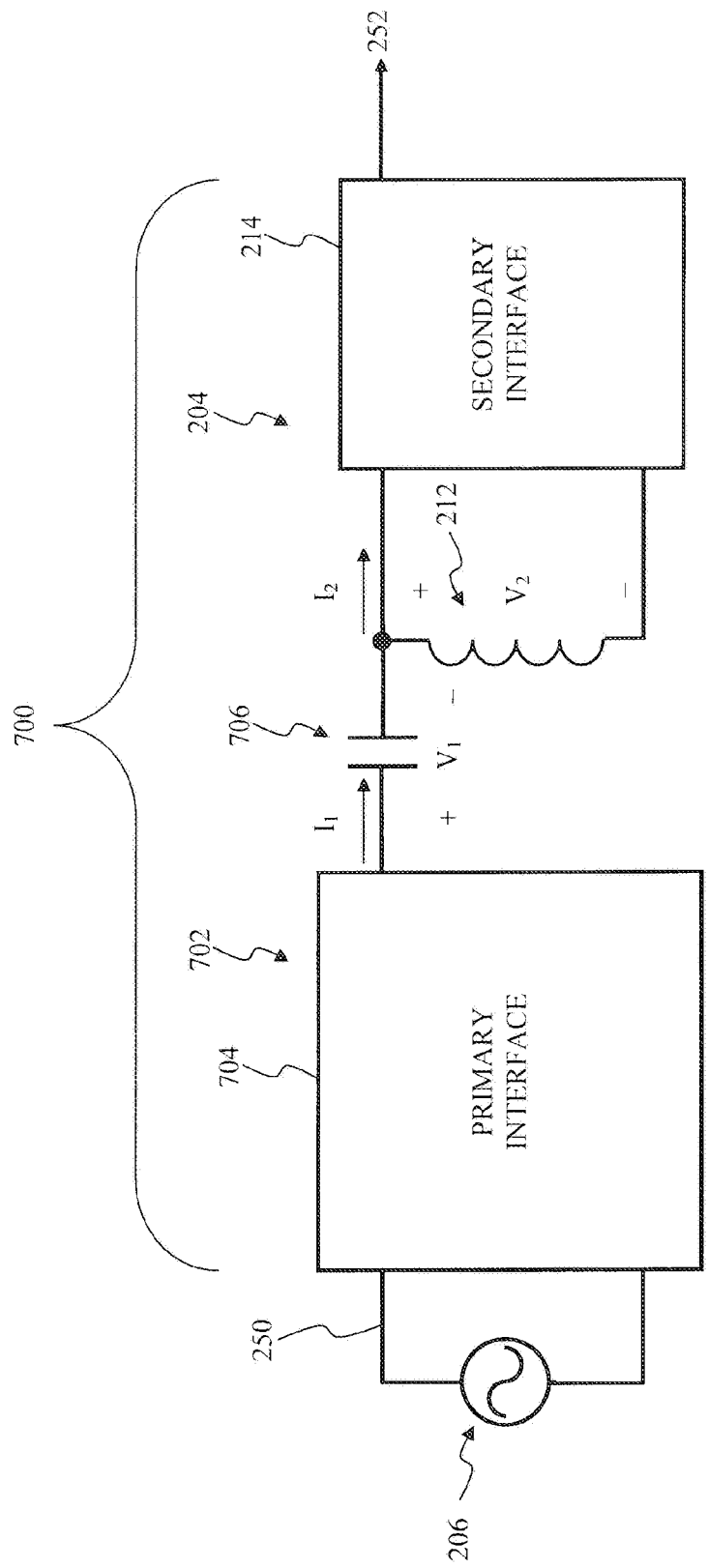
FIG. 7 illustrates a block diagram of an exemplary capacitively coupled clock distribution network according to an exemplary embodiment of the present disclosure.

Exemplary Capacitively Coupled Clock Distribution Network that can be Implemented within the Synchronous Sequential Logic System FIG. 7 illustrates a block diagram of an exemplary capacitively coupled clock distribution network according to an exemplary embodiment of the present disclosure. A clock distribution network 700 distributes one or more clock signals, such as the operational clocking signals 154.1 through 154.n to provide an example, from a common point to various locations within a synchronous sequential logic circuit. The clock distribution network 700 includes the secondary distribution node 204 and a primary distribution node 702. The clock distribution network 700 can represent an exemplary embodiment of the clock distribution network 106.

The primary distribution node 702 effectively transfers the primary clocking signal 250 to the secondary distribution node 204 via capacitive coupling. The primary distribution node 702 includes a primary interface 704 and a primary capacitance 706. The primary interface 704 can be implemented using one or more passive devices, such as one or more resistors, one or more capacitors, and/or one or more inductors to provide some examples, one or more active devices, such as one or more switches to provide some examples, and/or one or more transmission lines to couple the one or more passive devices and/or the one or more active devices to the clock generator 206 and/or the primary capacitance 706. The primary interface 704 can be implemented in a substantially similar manner as the primary interface 208 as described in FIG. 2 through FIG. 5.

The primary clocking signal 250 causes a first current $I_1$ to flow through the primary capacitance 706 which causes a first voltage $V_1$ to appear onto the primary capacitance 706. The first voltage $V_1$ and/or the first current $I_1$ are effectively transferred from the primary capacitance 706 to the second inductance 212 within the secondary distribution node 204 to provide the second voltage $V_2$ and/or the second current $I_2$ to the secondary distribution node 204. Capacitive coupling occurs when the primary capacitance 706 and the second inductance 212 are arranged so that a change in the first voltage $V_1$ in the primary capacitance 706 causes the second current $I_2$ to be induced in the second inductance 212. Specifically, changes in the first voltage $V_1$ cause the primary capacitance 706 to generate a changing electric field which induces the second current $I_2$ onto the second inductance 212.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the present disclosure should not be limited by any of the above-described exemplary embodiments, but should be defined only in accordance with the following claims and their equivalents.

What is claimed is:

1. A clock distribution system, comprising:
   a clock generator configured to provide a reference clock; and
   a clock distribution network having a primary distribution node and a secondary distribution node, the primary distribution node being configured to couple the reference clock to the secondary distribution node, the secondary distribution node being configured to resonate at a resonant frequency in response to receiving the reference clock to provide a plurality of clocking signals.

2. The clock distribution system of claim 1, further comprising:
   a sequential logic module configured to sequentially process an input signal in accordance with the plurality of clocking signals to provide an output signal.

3. The clock distribution system of claim 2, wherein the sequential logic module comprises:
   a plurality of digital logic components configured to be triggered by the plurality of clocking signals to sequentially operate upon the input signal to provide the output signal.

4. The clock distribution system of claim 1, wherein the primary distribution node is configured to inductively couple the reference clock to the secondary distribution node.

5. The clock distribution system of claim 1, wherein the primary distribution node is configured to capacitively couple the reference clock to the secondary distribution node.

6. The clock distribution system of claim 1, wherein the secondary distribution node comprises:
   a resonant tuning circuit configured to oscillate at the resonant frequency in response to the secondary distribution node receiving the reference clock to provide at least one of the plurality of clocking signals.

7. The clock distribution system of claim 6, wherein the resonant tuning circuit comprises:
   an inductance configured to receive the reference clock from the primary distribution node; and
   a capacitance configured to be charged in response to the inductance receiving the reference clock.

8. The clock distribution system of claim 7, wherein the resonant tuning circuit is further configured to oscillate at the resonant frequency once the capacitance is charged.

9. A clock distribution system, comprising:
   a clock generator configured to provide a reference clock; and
   a clock distribution network having a primary distribution node and a secondary distribution node, the primary distribution node being configured to couple the reference clock to the secondary distribution node, the secondary distribution node comprising:
      an inductance configured to inductively-receive the reference clock from the primary distribution node, and
      a capacitance configured to be charged in response to the inductance receiving the reference clock,
      wherein the inductance and the capacitance are configured to form a resonant tuning circuit that is configured to oscillate at a resonant frequency in response to the secondary distribution node receiving the reference clock to provide a clocking signal.

10. The clock distribution system of claim 9, wherein the resonant frequency is different from a frequency of the reference clock.

11. The clock distribution system of claim 9, wherein the secondary distribution node further comprises:
   a second inductance configured to inductively receive the reference clock from the primary distribution node, and
   a second capacitance configured to be charged in response to the second inductance receiving the reference clock,
   wherein the second inductance and the second capacitance are configured to form a second resonant tuning circuit that is configured to oscillate at a second resonant frequency in response to the secondary distribution node receiving the reference clock to provide a second clocking signal.

12. The clock distribution system of claim 11, wherein the second resonant frequency is different from the resonant frequency.

13. The clock distribution system of claim 9, wherein the primary distribution node is configured to inductively couple the reference clock to the secondary distribution node.

14. The clock distribution system of claim 9, wherein the primary distribution node is configured to couple the reference clock to the secondary distribution node via mutual inductance between the primary distribution node and the secondary distribution node.

15. A clock distribution system, comprising:
   a clock generator configured to provide a reference clock; and
   a clock distribution network having a primary distribution node and a secondary distribution node, the primary distribution node being configured to couple the reference clock to the secondary distribution node, the secondary distribution node comprising:
      a capacitance configured to capacitively receive the reference clock from an electric field provided by the primary distribution node, and
      an inductance configured to be charged in response to the capacitance capacitively receiving the reference clock,
      wherein the inductance and the capacitance are configured to form a resonant tuning circuit that is configured to oscillate at a resonant frequency in response to the secondary distribution node receiving the reference clock to provide a clocking signal.

16. The clock distribution system of claim 15, wherein the resonant frequency is different from a frequency of the reference clock.

17. The clock distribution system of claim 15, wherein the secondary distribution node further comprises:
   a second capacitance configured to capacitively receive the reference clock from the primary distribution node, and
   a second inductance configured to be charged in response to the second capacitance capacitively receiving the reference clock,
   wherein the second capacitance and the second inductance are configured to form a second resonant tuning circuit that is configured to oscillate at a second resonant frequency in response to the secondary distribution node receiving the reference clock to provide a second clocking signal.

18. The clock distribution system of claim 17, wherein the second resonant frequency is different from the resonant frequency.

19. The clock distribution system of claim 15, wherein the resonant tuning circuit is further configured to oscillate at the resonant frequency once the inductance is charged.

20. The clock distribution system of claim 15, wherein the primary distribution node is configured to capacitively couple the reference clock to the secondary distribution node.

* * * * *

UNITED STATES PATENT AND TRADEMARK OFFICE
CERTIFICATE OF CORRECTION

PATENT NO. : 9,264,046 B2  
APPLICATION NO. : 14/626445  
DATED : February 16, 2016  
INVENTOR(S) : Chang et al.

Page 1 of 1

It is certified that error appears in the above-identified patent and that said Letters Patent is hereby corrected as shown below:

In the Claims

In column 15, line 18, please replace "inductively-receive" with --inductively receive.--

Signed and Sealed this
Fourteenth Day of June, 2016

Michelle K. Lee
*Director of the United States Patent and Trademark Office*